US010002921B2

(12) United States Patent
Basker et al.

(10) Patent No.: US 10,002,921 B2
(45) Date of Patent: Jun. 19, 2018

(54) NANOWIRE SEMICONDUCTOR DEVICE INCLUDING LATERAL-ETCH BARRIER REGION

(71) Applicant: International Business Machines Corporation, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/487,675

(22) Filed: Apr. 14, 2017

(65) Prior Publication Data
US 2017/0221991 A1    Aug. 3, 2017

Related U.S. Application Data

(60) Division of application No. 15/229,690, filed on Aug. 5, 2016, which is a continuation of application No.
(Continued)

(51) Int. Cl.
*H01L 29/06* (2006.01)
*H01L 21/84* (2006.01)
(Continued)

(52) U.S. Cl.
CPC ......... *H01L 29/0673* (2013.01); *B82Y 10/00* (2013.01); *H01L 21/02321* (2013.01);
(Continued)

(58) Field of Classification Search
None
See application file for complete search history.

(56) References Cited

U.S. PATENT DOCUMENTS 9,455,317 B1 * 9/2016 Basker ............... H01L 29/0673
9,502,523 B1   11/2016 Basker
(Continued)

OTHER PUBLICATIONS

Basker et al., "Nanowire Semiconductor Device Including Lateral-Etch Barrier Region", U.S. Appl. No. 15/495,239, filed Apr. 24, 2017.
(Continued)

*Primary Examiner* — Daniel Whalen
(74) *Attorney, Agent, or Firm* — Cantor Colburn LLP; Vazken Alexanian

(57) ABSTRACT

A semiconductor device includes a semiconductor-on-insulator water having a buried layer. The buried layer includes therein opposing etch barrier regions and a gate region between the etch barrier regions. The semiconductor device further includes at least one nanowire having a channel portion interposed between opposing source/drain portions. The channel portion is suspended in the gate region. A gate electrode is formed in the gate region, and completely surrounds all surfaces of the suspended nanowire. The buried layer comprises a first electrical insulating material, and the etch barrier regions comprising a second electrical insulating material different from the first electrical insulating material.

18 Claims, 11 Drawing Sheets

Related U.S. Application Data

14/950,011, filed on Nov. 24, 2015, now Pat. No. 9,502,523, which is a continuation of application No. 14/748,521, filed on Jun. 24, 2015, now Pat. No. 9,455,317.

(51) Int. Cl.

| | | |
|---|---|---|
| *H01L 21/3115* | (2006.01) | |
| *H01L 29/66* | (2006.01) | |
| *H01L 29/417* | (2006.01) | |
| *H01L 21/311* | (2006.01) | |
| *H01L 29/423* | (2006.01) | |
| *H01L 29/786* | (2006.01) | |
| *H01L 21/02* | (2006.01) | |
| *H01L 29/78* | (2006.01) | |
| *H01L 21/265* | (2006.01) | |
| *H01L 21/306* | (2006.01) | |
| *H01L 21/308* | (2006.01) | |
| *H01L 21/762* | (2006.01) | |
| *B82Y 10/00* | (2011.01) | |
| *H01L 29/775* | (2006.01) | |
| *H01L 21/3105* | (2006.01) | |
| *H01L 29/08* | (2006.01) | |
| *H01L 29/161* | (2006.01) | |
| *H01L 29/167* | (2006.01) | |

(52) U.S. Cl.
CPC ...... *H01L 21/02332* (2013.01); *H01L 21/265* (2013.01); *H01L 21/26506* (2013.01); *H01L 21/3085* (2013.01); *H01L 21/30604* (2013.01); *H01L 21/31051* (2013.01); *H01L 21/31111* (2013.01); *H01L 21/31155* (2013.01); *H01L 21/76243* (2013.01); *H01L 21/845* (2013.01); *H01L 29/0649* (2013.01); *H01L 29/0676* (2013.01); *H01L 29/0847* (2013.01); *H01L 29/161* (2013.01); *H01L 29/167* (2013.01); *H01L 29/41783* (2013.01); *H01L 29/42392* (2013.01); *H01L 29/6656* (2013.01); *H01L 29/66439* (2013.01); *H01L 29/66545* (2013.01); *H01L 29/66795* (2013.01); *H01L 29/775* (2013.01); *H01L 29/785* (2013.01); *H01L 29/78618* (2013.01); *H01L 29/78696* (2013.01)

(56) References Cited

U.S. PATENT DOCUMENTS

| | | |
|---|---|---|
| 2016/0380054 A1 | 12/2016 | Basker |
| 2016/0380083 A1 | 12/2016 | Basker |
| 2017/0229553 A1* | 8/2017 | Basker .............. H01L 29/42392 |

OTHER PUBLICATIONS

List of IBM Patents or Patent Applications Treated as Related; (Appendix P), Filed Jul. 13, 2017; 2 pages.

* cited by examiner

NANOWIRE SEMICONDUCTOR DEVICE INCLUDING LATERAL-ETCH BARRIER REGION

DOMESTIC PRIORITY

This application is a divisional of U.S. patent application Ser. No. 15/229,690, filed Aug. 5, 2016, which is a continuation of U.S. patent application Ser. No. 14/950,011, filed Nov. 24, 2015, which is a continuation of U.S. patent application Ser. No. 14/748,521, filed Jun. 24, 2015, the disclosures of which are incorporated by reference herein their entirety.

BACKGROUND

The present invention relates to semiconductor devices, and more specifically, to nanowire field effect transistor (FET) devices.

The use of non-planar semiconductor devices such as, for example, Fin FET devices (i.e., FinFETs) is desirable due the ability to reduce the overall size of the semiconductor device. The fabrication of non-planar semiconductor devices such as, for example, gate-all-around nanowire FET devices, typically utilizes a semiconductor-on-insulator (SOI) substrate to reduce parasitic device capacitance. SOI substrates typically include a bulk substrate, a buried insulator layer located atop the bulk substrate, and a semiconductor-on-insulator (SOI) layer located atop the buried insulator layer.

Nanowire FET devices have become a popular non-planar semiconductor device due to their improved channel electrostatics control. Formation of nanowire FET devices typically includes forming one or more semiconductor fins atop a SOI layer and then undercutting the fins located in the gate region to form suspended fins, typically referred to as suspended nanowires. The undercutting process allows access to the complete surface of the suspended nanowires. In this manner, a gate electrode formed in the gate region contacts all sides of the nanowire achieving a gate-all-around configuration which improves channel electrostatics control. However, conventional undercutting processes used to form the suspended nanowires in the gate region have tendency to etch in an isotopic manner which laterally extends the gate region. In some instances, the lateral undercut beneath a raised source/drain region which can cause an electrical short circuit path between the gate electrode formed in the gate region and epitaxial material used to form raised source/drain regions of the device.

SUMMARY

According to at least one non-limiting embodiment of the present invention, a method of fabricating a semiconductor device comprises forming a semiconductor-on-insulator (SOI) wafer including a buried insulator layer. The buried insulator layer includes etch barrier regions comprising a first electrical insulator material, and an undercutting region interposed between the etch barrier regions. The undercutting region comprises a second electrical insulator material different from the first electrical insulator material. The method further includes forming at least one semiconductor fin on an upper surface of the buried insulator layer. The at least one semiconductor fin includes a channel portion formed on the undercutting region and source/drain portions formed on respective etch barrier regions. The method further includes performing an etching process that etches the undercutting region to undercut the channel portion while the second electrical insulating material prevents etching beneath the source/drain portions of the at least one semiconductor fin.

According to another non-limiting embodiment of the invention, a semiconductor device includes a semiconductor-on-insulator wafer having a buried oxide layer. The buried oxide layer includes therein opposing etch barrier regions and a gate region between the etch barrier regions. The semiconductor device further includes at least one nanowire having a channel portion interposed between opposing source/drain portions. The channel portion is suspended in the gate region. A gate electrode is formed in the gate region, and completely surrounds all surfaces of the suspended nanowire. The buried oxide layer comprises a first electrical insulating material, and the etch barrier regions comprising a second electrical insulating material different from the first electrical insulating material.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings. With reference to FIGS. 1-10, a series of views illustrating a method of forming a nanowire FET device according to exemplary embodiments of the present teachings, in which:

FIG. 1 illustrates an semiconductor-on-insulator (SOI) wafer including a buried insulator layer and a plurality of semiconductor fins on an upper surface of the buried insulator layer;

FIG. 3 illustrates the wafer of FIG. 2 following deposition of a block spacer layer that covers the dummy gate and the fins;

FIG. 4 illustrates the wafer of FIG. 3 after etching the block spacer layer to re-exposed the source/drain regions of the fins while maintaining gate spacers on opposing sidewalls of the dummy gate;

FIG. 5 illustrates the wafer of FIG. 4 undergoing an ion implantation process to form lateral-etch barrier regions in the buried insulator layer;

FIG. 6 illustrates the wafer of FIG. 5 after epitaxially growing raised source/drain regions from the exposed fins and onto the lateral-etch barrier regions to merge together the source/drain regions of the fins;

FIG. 7 illustrates the wafer of FIG. 6 following deposition of a flowable insulator material on the an upper surface of the raised source/drain epi regions and planarizing the flowable insulator layer flush with an upper surface of the dummy gate;

FIG. 8 illustrates the wafer of FIG. 7 after removing the dummy gate to form a trench that exposes channel portions of the fins and the buried insulator layer located between the gate spacers;

FIG. 9 illustrates the wafer of FIG. 8 following a laterally-controlled etch to form suspended nanowires that are anchored by the gate spacers; and FIG. 10 illustrates the wafer of FIG. 9 after depositing a gate material in the trench to form a gate electrode that contacts all surfaces of the suspended nanowires.

DETAILED DESCRIPTION

Various embodiments provide a nanowire FET device including a lateral-etch barrier layer configured to prevent lateral etching beneath the gate spacers when undercutting semiconductor fins to form suspended nanowires in the gate region. According to an embodiment, nitrogen (N) or carbon (C) ions, for example, are implanted in exposed regions of a buried insulation layer included in a semiconductor-on-insulator (SOI) wafer to form a doped-oxide lateral-etch barrier layer at opposing sides of a region of the buried insulator layer located beneath gate region. A wet etch process using a hydrofluoric (HF) solution, for example, may be used to etch the buried insulator layer and form the suspended nanowires. The doped-oxide lateral-etch barrier layer has a slower etch rate with respect to the material of the remaining buried insulator layer. Accordingly, the region of the buried insulator layer located beneath the semiconductor fins can be etched to undercut the fins and form the suspended nanowire, while the later-etch barrier layer prevents the HF wet etch solution from etching laterally beneath the fins and gate spacers located in the designated source/drain regions. In this manner, device shorting can be prevented when depositing a metal material in the gate region to form a gate-all-around nanowire FET device.

Figure 1:
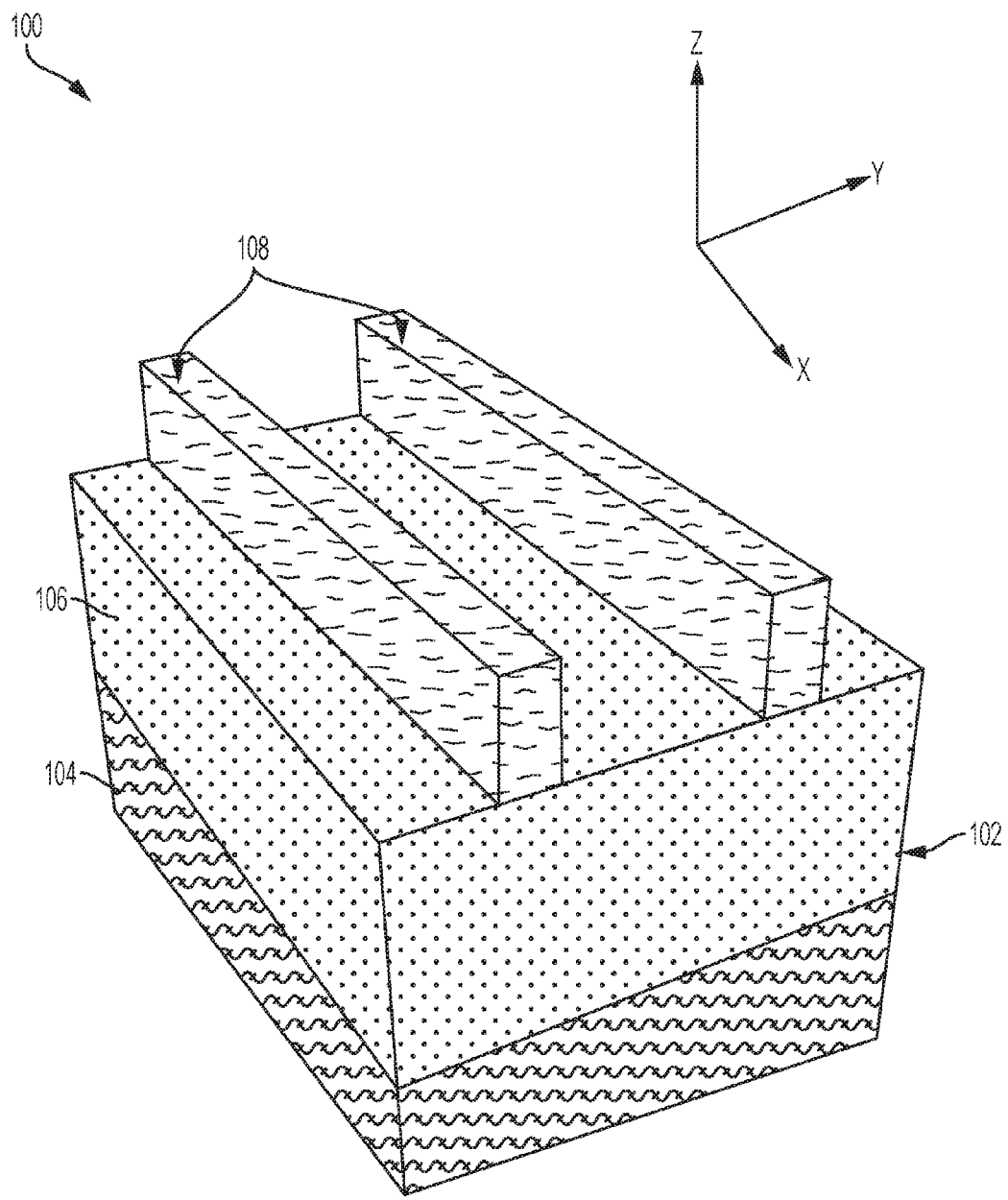

With reference now to FIG. 1, a semiconductor device 100 including a semiconductor-on-insulator (SOI) wafer 102 is illustrated according to a non-limiting embodiment. The SOI wafer 102 extends along a first direction (e.g., X-axis) to define a wafer length, a second direction (e.g., Y-axis) to define a wafer width, and a third direction (e.g., Z-axis) to define a wafer height. The SOI wafer 102 further includes a bulk layer 104, a buried insulator layer 106 formed on an upper surface of the bulk layer 104, and one or more semiconductor fins 108 formed on an upper surface of the buried insulator layer 106. The bulk layer 104 is formed of silicon (Si), for example, and has a height (e.g., along the Z-axis) ranging from approximately 2 millimeters (mm) to approximately 6 mm. The buried insulator layer 106 is formed of a first electrical insulating material such as silicon dioxide ($SiO_2$), for example, and has a height (e.g., along the Z-axis) ranging from approximately 100 nanometers (nm) to approximately 150 nm. The fins 108 can be formed according to a well-known side image transfer (SIT) process to pattern an active semiconductor layer, e.g., a silicon layer (not shown) formed on an upper surface of the buried insulator layer 104. More specifically, the SIT process typically utilizes a block hardmask layer (not shown) formed on an upper surface of the active semiconductor layer. The block hardmask layer is then patterned to designate the desired locations of the fins 108, and the pattern is transferred into the active semiconductor layer. The result is one or more semiconductor fins 108 atop the buried insulator layer 104. According to a non-limiting embodiment, the fins 108 have a width (e.g., along the Y-axis) ranging from approximately 6 nm to approximately 12 nm, and a height (e.g., along the Z-axis) ranging from approximately 6 nm to approximately 45 nm.

Figure 2A:
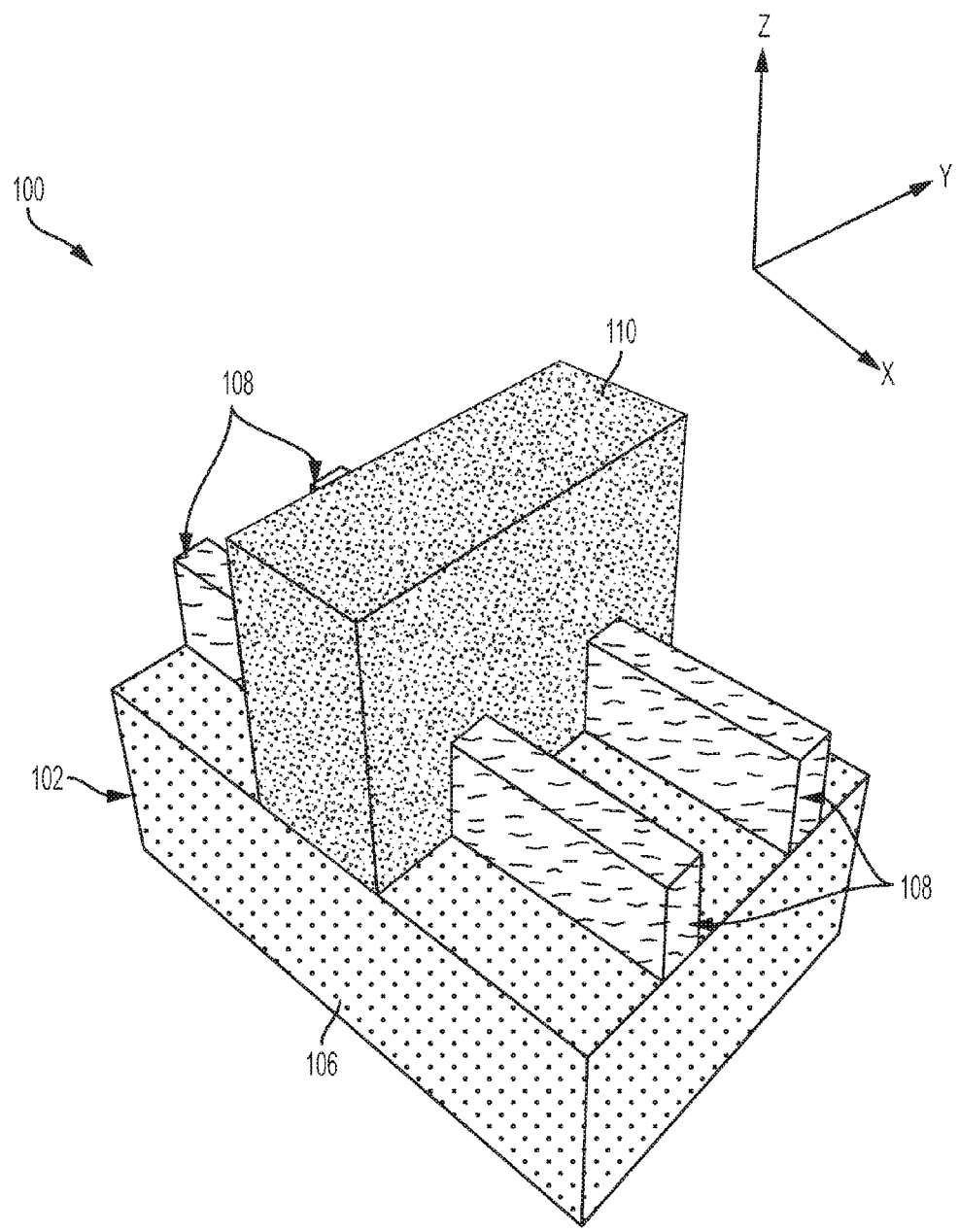
FIGS. 2A-2B illustrates the wafer of FIG. 1 after forming a dummy gate on an upper surface of the buried insulator layer to cover a center portion of the fins and define opposing source/drain regions.
Figure 2B:
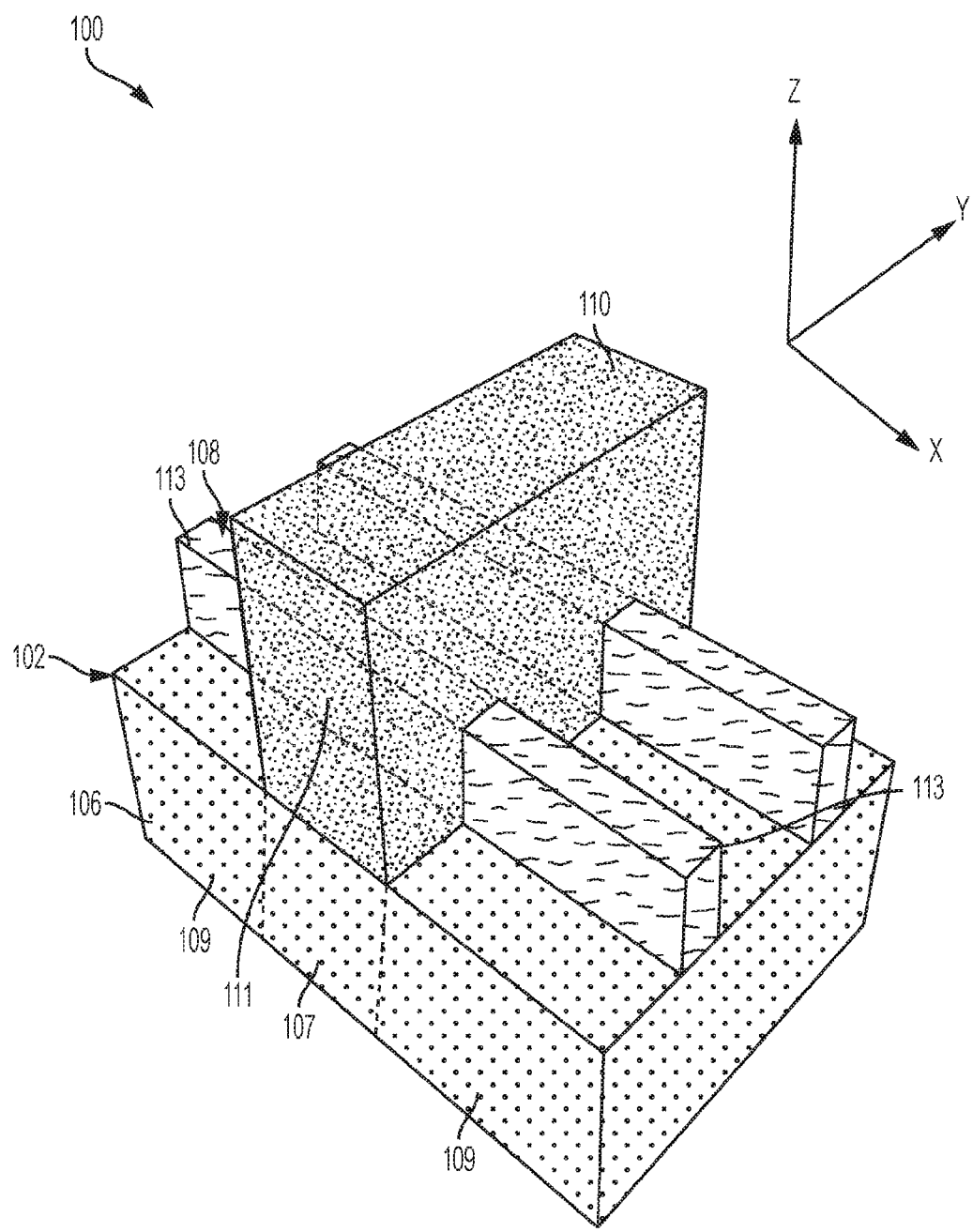

Turning now to FIGS. 2A-2B, the semiconductor device 100 is illustrated following a gate formation process that forms a dummy gate 110 atop the buried insulator layer 106. The dummy gate 110 is formed of polysilicon (poly-Si), for example, and covers a middle portion of the fins 108. According to a non-limiting embodiment, the dummy gate 110 has a length (e.g., along the X-axis) ranging from approximately 10 nm to approximately 25 nm, and a height (e.g., along the Z-axis) ranging from approximately 100 nm to approximately 120 nm.

The dummy gate 110 defines various regions of the buried insulator layer 106 and various portions of the fins 108 as illustrated in FIG. 2B. Namely, the region of the buried insulator layer 106 covered by the dummy gate 110 is hereinafter referred to as an undercutting region 107, while regions of the buried insulator layer 106 located at opposing sides of the dummy gate 110 are hereinafter referred to as exposed regions 109. Accordingly, the fins 108 include a channel portion 111 interposed between opposing source/drain portions 113. The channel portion 111 (covered by the dummy gate 110) is formed on an upper surface of the exposed regions 107, while the uncovered source/drain portions 113 are formed on an upper surface of a respective exposed region 109.

Figure 3:
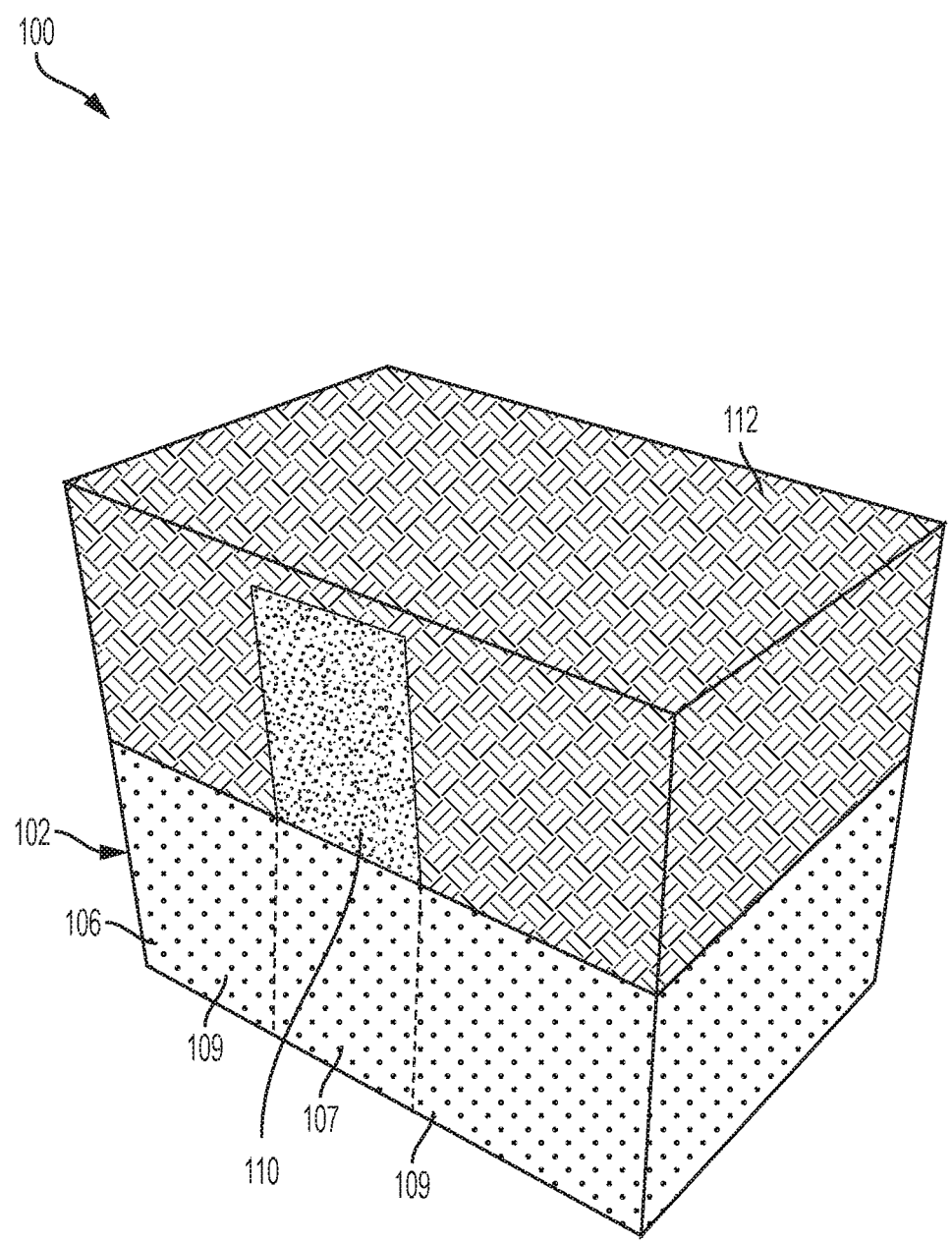

Referring now to FIG. 3, a block spacer layer 112 is deposited atop the buried insulator layer 106 using, for example, a chemical-vapor deposition (CVD) process. The block spacer layer 112 covers the source/drain portions 113 of the fins 108 and the dummy gate 110. According to a non-limiting embodiment, the block spacer layer 112 is formed of a low-dielectric (low-k) material including, but not limited to, silicon nitride (SiN), silicon carbon nitride (SiCN) or silicon boron carbon nitride (SiBCN). The block spacer layer 112 can be used to form gate spacers (not shown in FIG. 3) as discussed in greater detail below.

Figure 4:
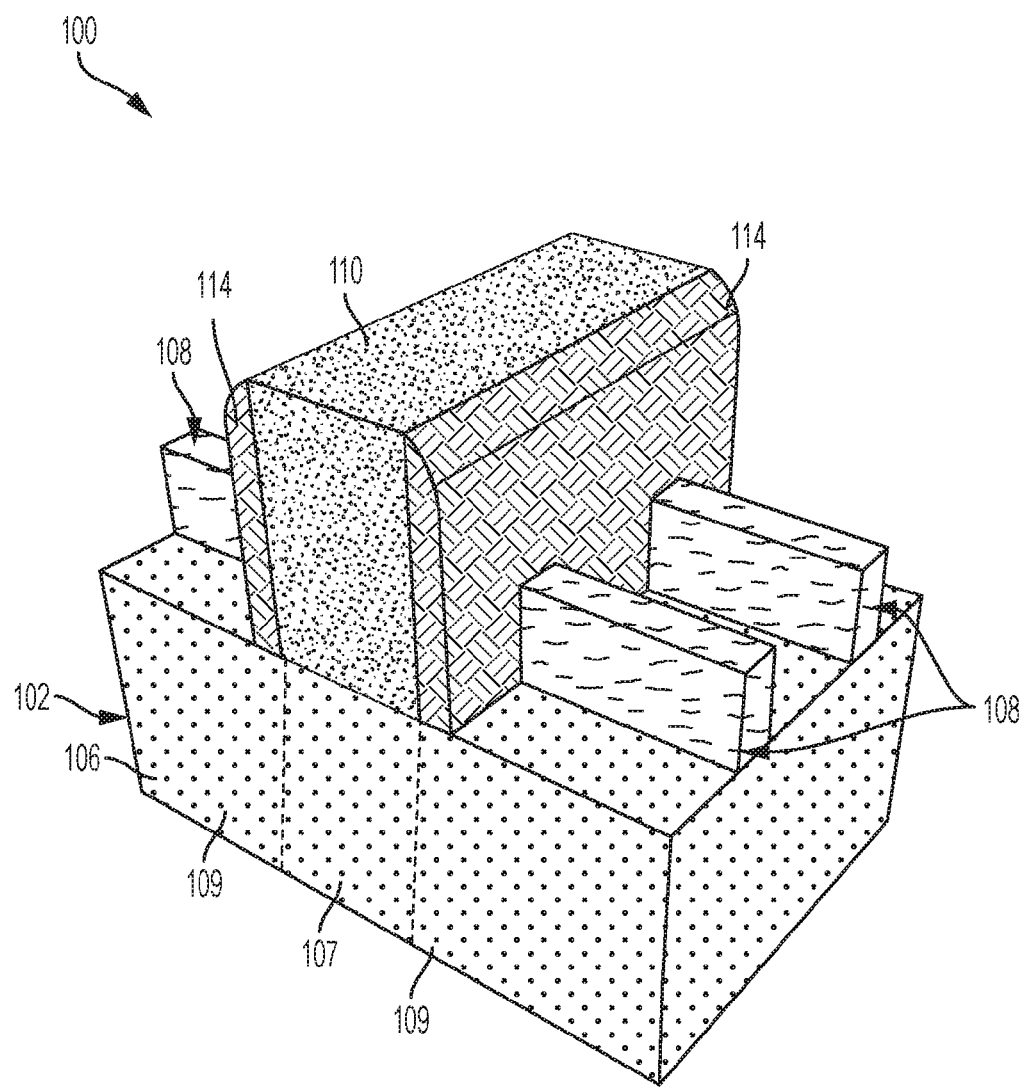

Referring to FIG. 4, the semiconductor device 100 is illustrated following an etching process that forms gate spacers 114 on opposing sidewalls of the dummy gate 110. Various etching process may be performed including, for example, an anisotropic (directional) reactive ion etch (RIE) process that is selective to the fin material (e.g., Si), the dummy gate material (e.g., poly-Si), and the buried insulator layer material (e.g., $SiO_2$). In this manner, the gate spacers 114 are formed on sidewalk of the dummy gate 110 while revealing the source/drain portions 113 of the fin 108 and the exposed regions of the buried insulator layer 106.

Figure 5:
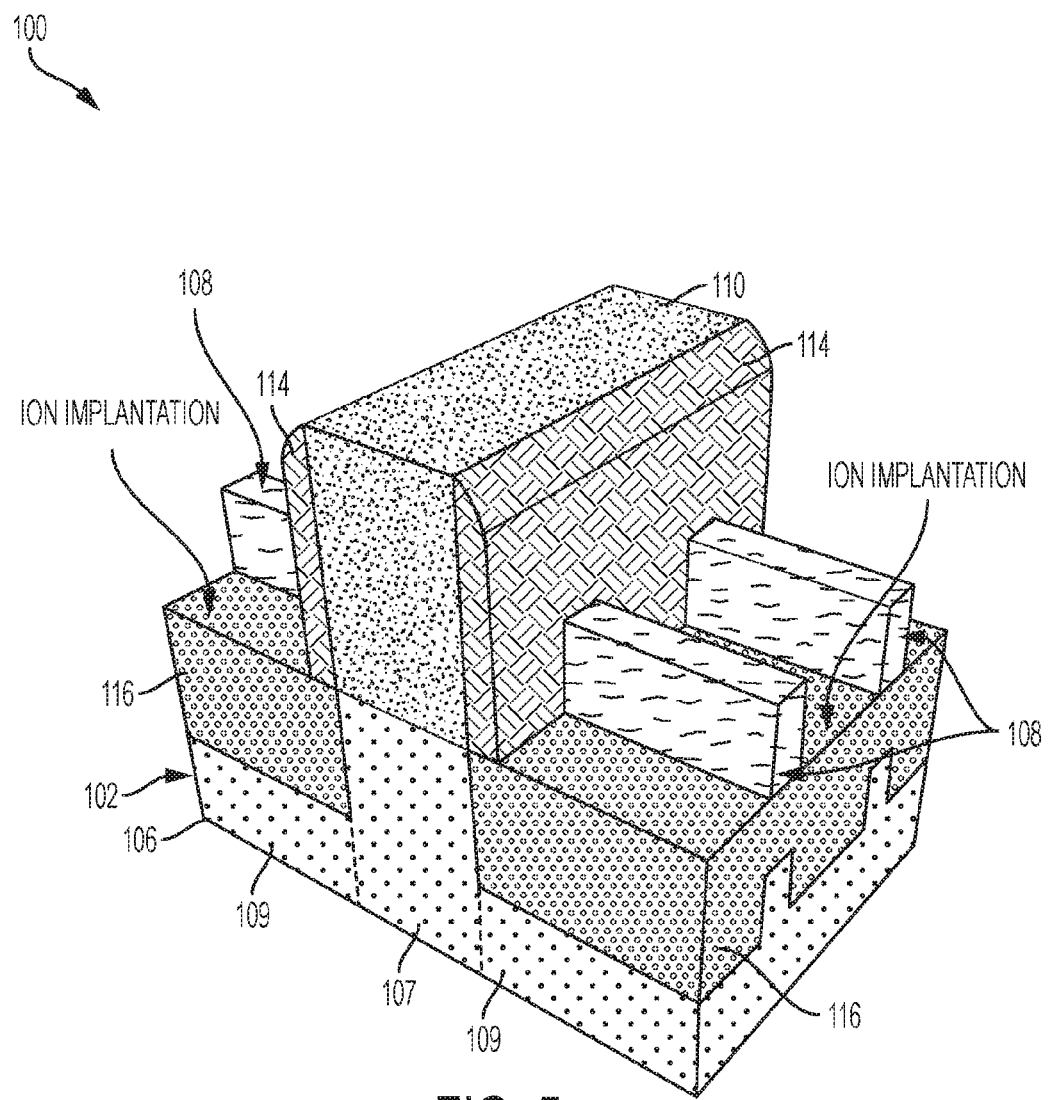

Turning to FIG. 5, an ion implantation process is performed convert a portion of the exposed regions 107 into etch barrier regions 116 formed of a second electrical insulating material different from the first electrical insulating material of the non-implanted buried insulator layer 106 (e.g., $SiO_2$). More specifically, the ion implantation process includes implanting nitrogen (N) ions or carbon (C) ions into the buried insulator layer 106. In the case where nitrogen (N) ions are implanted, a nitrogen-doped oxide (e.g., SiON) etch barrier region 116 formed. In the case where carbon (C) ions are implanted, a carbon-doped oxide (e.g., SiOC) etch barrier region 116 formed. The energy of the ion implantation source can be adjusted to control the desired depth of the etch barrier region 116. That is, increasing the energy of the ion implantation source increases the depth of the ion implantation and controls the vertical thickness (e.g., along the Z-axis) of the etch barrier region 116. According to a non-limiting embodiment, the etch barrier region 116 has a vertical thickness ranging from approximately 10 nm to approximately 40 nm. It should also be appreciated that the ions (e.g., the nitrogen ions or carbon ions) change the material composition of only the buried insulator layer 106. In this manner, the ions travel through the fins 108 without changing the material composition thereof. Accordingly, a mask is not needed to cover the fins 108 when performing the ion implantation process.

In either case described above, the second insulating material (e.g., SiON or SiOC) of the etch barrier layer 116 has an etch rate that is less than the etch rate of the first electrical insulating material (e.g., $SiO_2$) when exposed to various etching process such as, for example, a wet etching process utilizing a hydrofluoric (HF) solution. In this manner, regions of the buried insulator layer 106 formed of the first electrical insulating material (e.g., the undercutting region 107) can be etched while preserving portions of the buried insulator layer 106 formed of the second electrical insulating material (e.g., the etch barrier regions 116) as discussed in greater detail below.

Figure 6:
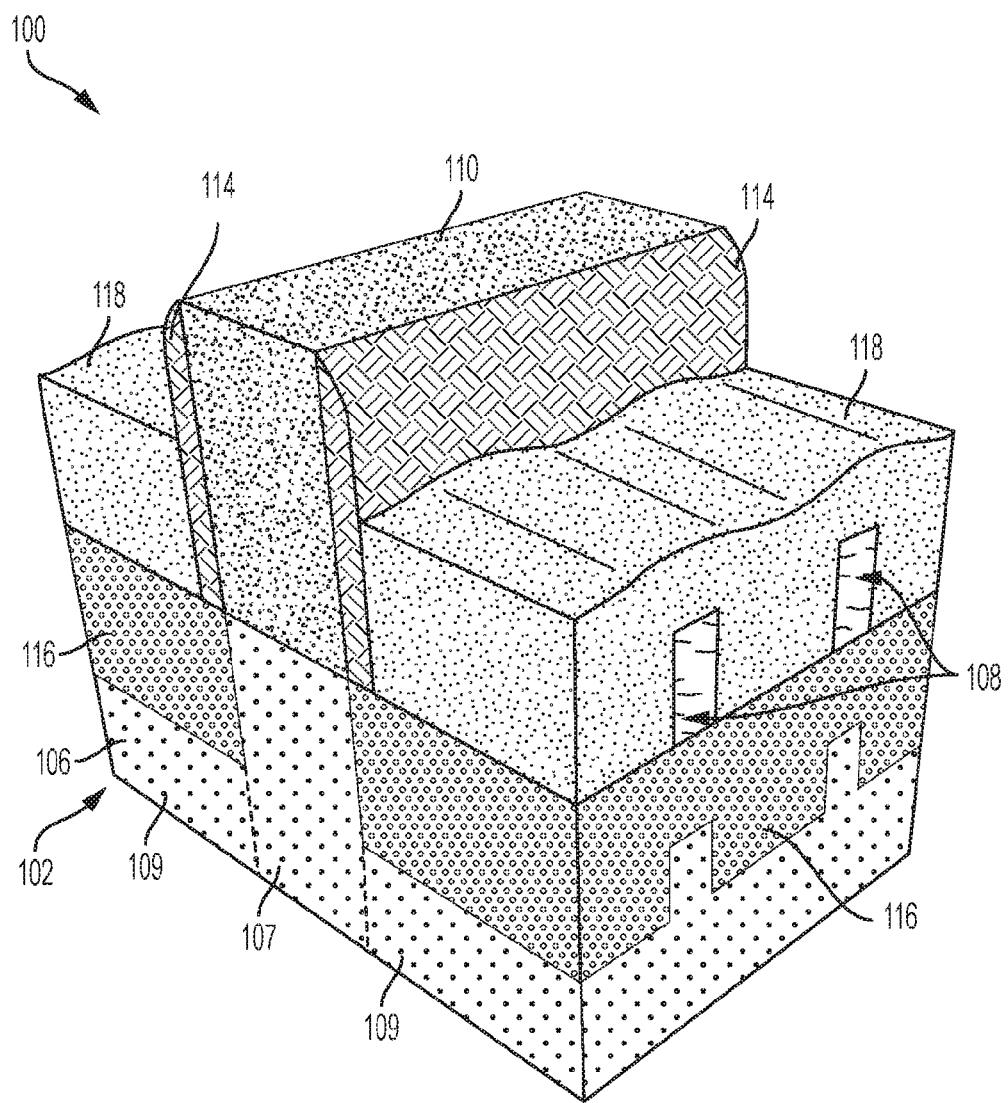

Turning now to FIG. 6, the semiconductor device 100 is illustrated following a well-known epitaxy process to grow a semiconductor material from the fins 108 and onto an upper surface of the etch barrier regions 116. The epitaxially grown semiconductor material may comprise, for example, silicon (Si) doped with phosphate (P) when forming a n-type semiconductor device. Alternatively, the epitaxially grown semiconductor material may comprise silicon (Si) or silicon germanium (Site) doped with boron (B) when forming a p-type semiconductor device. In this manner, raised source/drain contacts 118 are formed that cover the fins 108 and merge together the source/drain portions 113.

Figure 7:
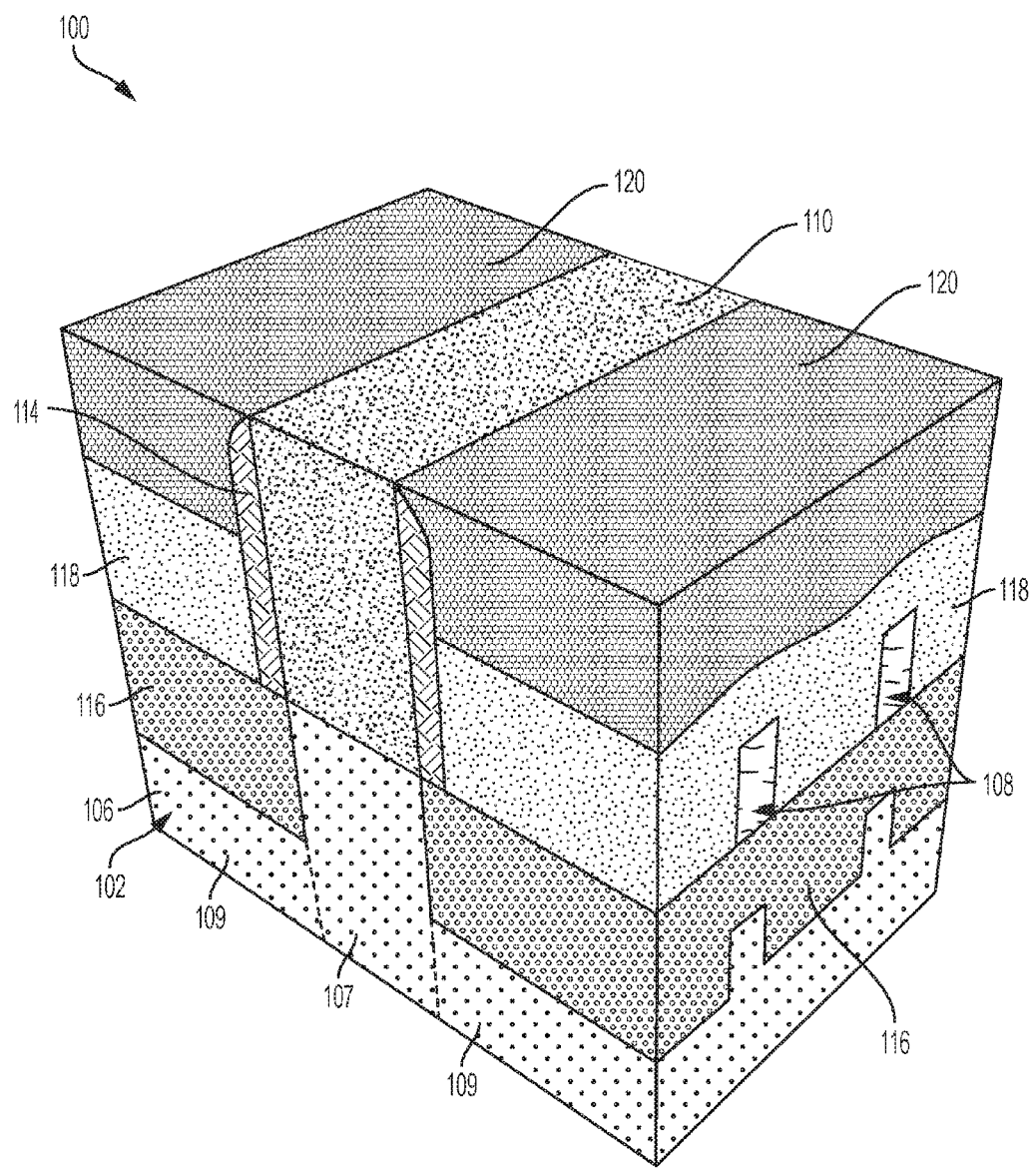

Referring to FIG. 7, a flowable insulator material 120 is deposited atop the raised source/drain contacts 118. More specifically, the flowable insulator material 120 is deposited on an upper surface of the source/drain contacts 118 to cover the gate spacers 114 and dummy gate 110. A chemical-mechanical polishing (CMP) procedure is subsequently performed until reaching the upper surface of the dummy gate 110 as further illustrated in FIG. 7. In this manner, the upper surface of the dummy gate 110, the upper surface of the gate spacers 114, and the upper surface of the flowable insulator material 120 are flush with one another. The flowable insulator material 120 is formed of, for example, a flowable oxide (FOX) material (e.g., $SiO_2$), and can serve to electrically isolate the raised source/drain contacts 118 from neighboring semiconductor devices (not shown) formed near the semiconductor 100.

Figure 8:
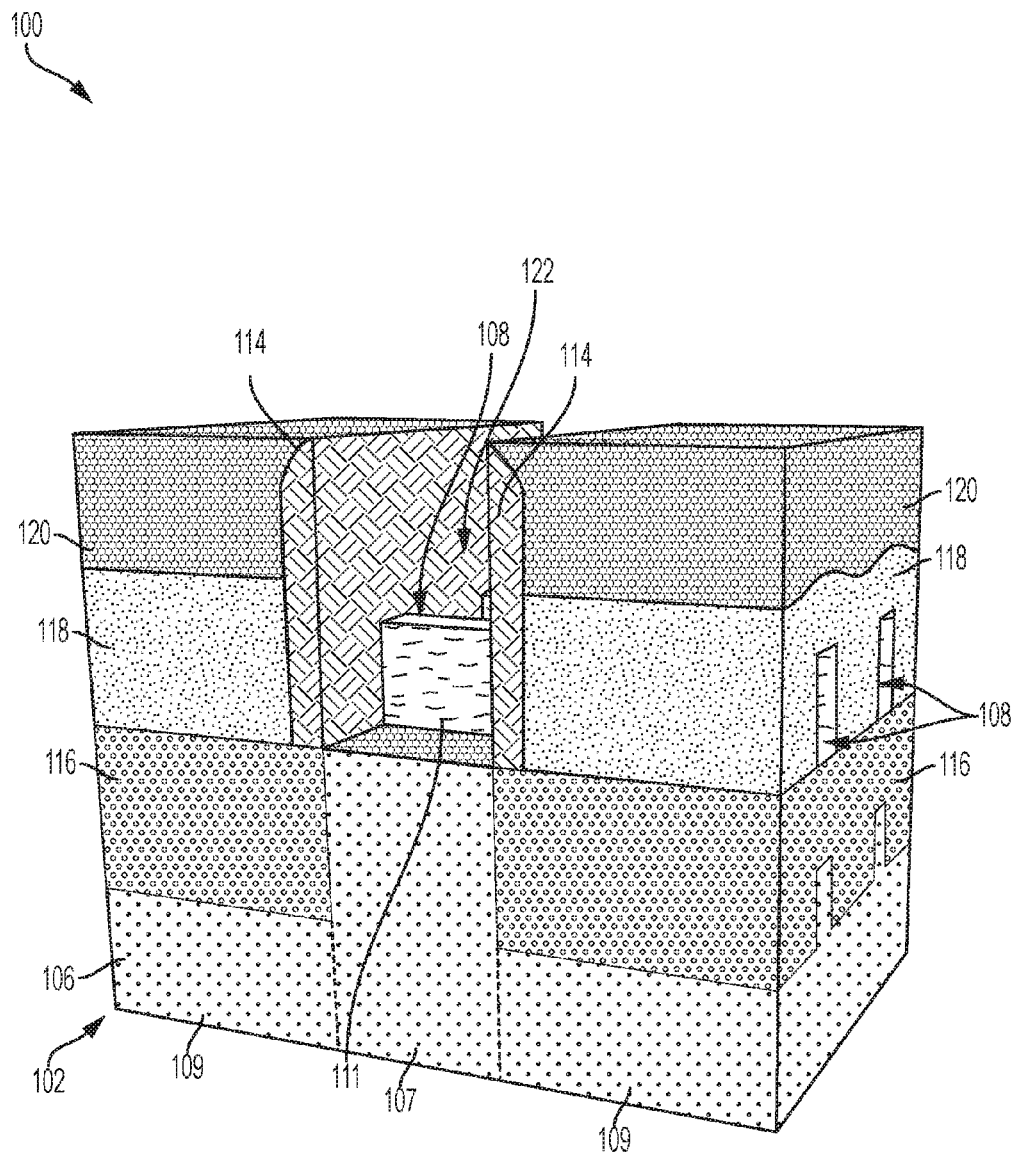

Turning to FIG. 8, the dummy gate 110 is removed to form a trench 12 in the gate region between the gate spacers 114. The dummy gate removal process may include a dry etch process followed by a wet etch cleaning process. Namely, a selective dry RIE that attacks only the dummy gate material is used to remove the dummy gate (not shown in FIG. 8) from the gate region and form the trench 122. In this manner, the dry RIE can be performed without requiring a mask to cover the flowable insulator material 120. Subsequently, a wet cleaning process can be applied to remove any residual dummy gate material from within the trench 122. The wet cleaning process may use, for example, a diluted HF and ammonium hydroxide ($NH_4OH$) solution. Since the wet etch time is short, any recession of the flowable insulator material 120 is negligible. Following removal of the dummy gate, the trench 122 exposes the channel portion 111 of the tins 108 and the undercutting region 107 of the buried insulator layer 106 as further illustrated in FIG. 8.

Figure 9:
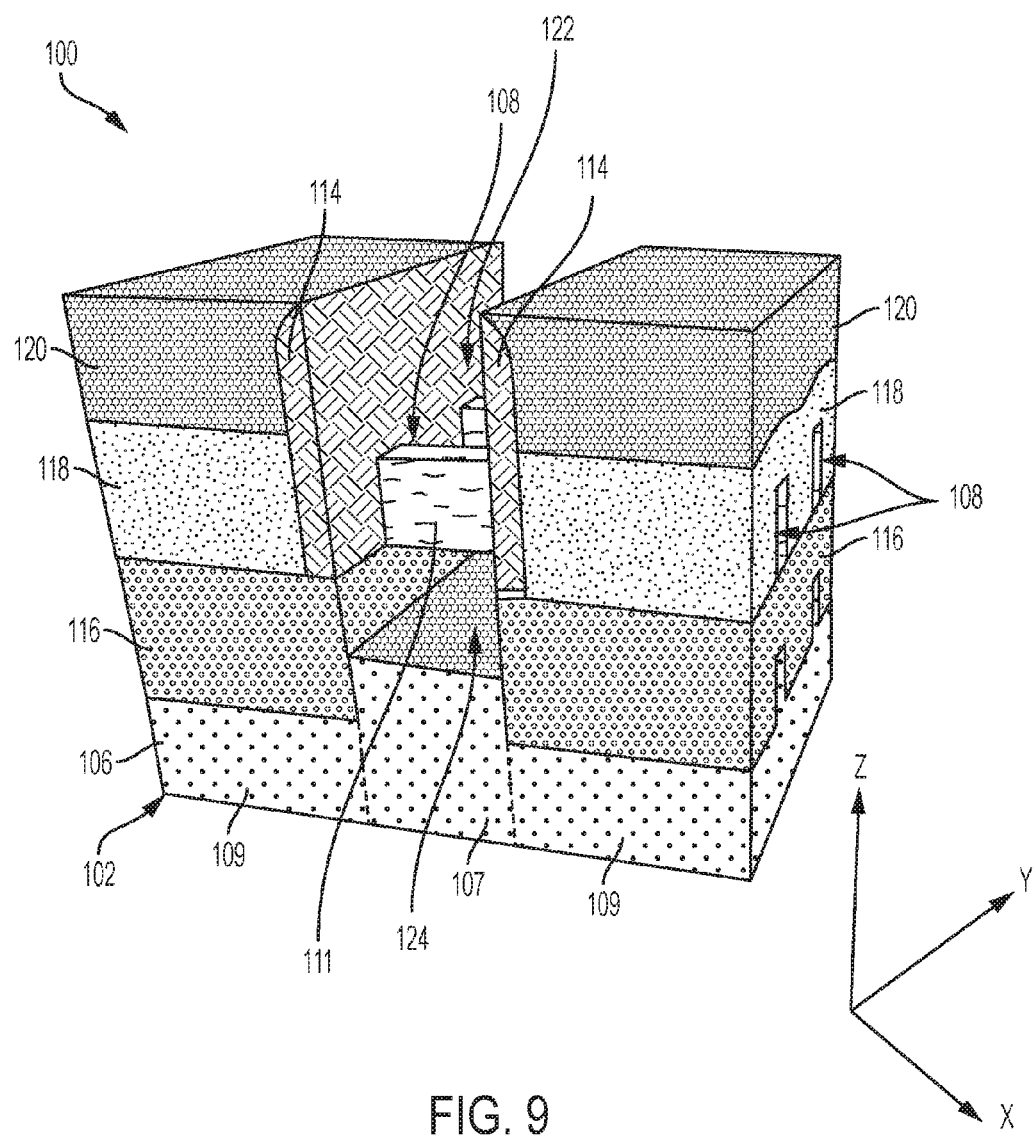

Referring to FIG. 9, the semiconductor device 100 is illustrated after selectively etching the undercutting region 107 to form a void 124 between the buried insulator layer 106 and the channel portion 111 of the fins 108. In this manner, one or more suspended fins, hereinafter referred to as suspended nanowires 108, are formed in the trench 122. The void 124 may define a distance between a remaining portion of the undercutting region 107 and the bottom surface of the fin channel portion 111 that ranges, for example, from approximately 20 nm to approximately 30 nm.

As described above, the second insulating material (e.g., SiON or SiOC) of the etch barrier layer 116 has an etch rate that is less than the etch rate of the first electrical insulating material (e.g., $SiO_2$) when exposed to various etching process such as, for example, a wet hydrofluoric (HF) etching solution. In this manner, the undercutting region 107 can be selectively etched while the etch barrier regions 116 are unetched and remain preserved. As a result, a bottom surface of the channel portion 111 is formed flush with an upper portion of the etch barrier regions 116, and a bottom portion of the gate spacers 114. That is, unlike conventional nanowire FET devices formed by undercutting the semiconductor fins, at least one embodiment of the invention excludes undercuttings that extend laterally (e.g., along the X-axis) beneath source/drain portions of the nanowire 108, beneath the spacers 114, and/or beneath the raised source/drain contacts 118.

Figure 10:
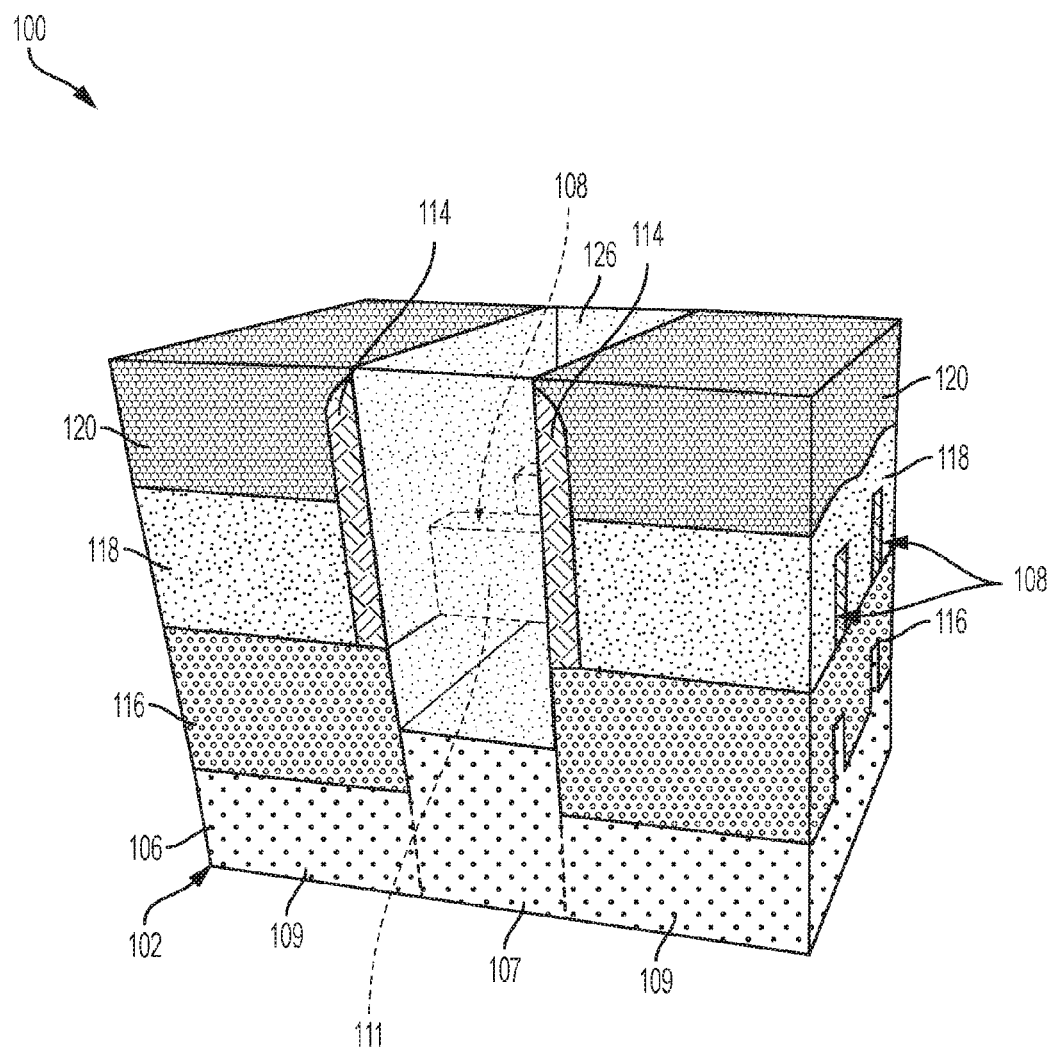

Turning now to FIG. 10, a replacement metal gate stack 126 is deposited in the previously formed trench (not shown in FIG. 10). More specifically, the gate stack material can be deposited atop the flowable insulator material 120 and into the trench to completely surround the suspended nanowires 108. The gate materials can be deposited using atomic layer deposition (ALD), for example, and can include one or more high-k gate dielectric materials including, but not limited to, hafnium silicate ($HfSiO_4$), zirconium silicate ($ZrSiO_4$), hafnium dioxide ($HfO_2$), and zirconium dioxide ($ZrO_2$). The gate materials may also include one or more gate conductor materials such as tungsten (W). Although also not illustrated, the previously formed trench 122 may also be lined with a work function metal film after depositing the high-k gate dielectric layer and prior to deposing the gate material 126 to control the voltage threshold of the device as understood by one of ordinary skill in the art.

Subsequently, a chemical-mechanical polishing (CMP) procedure is performed until reaching the upper surface of the flowable insulator layer 120. In this manner, the upper surface of the gate material 126 is formed flush with the upper surface of the gate spacers 114, and the upper surface of the flowable insulator material 120. Accordingly, a gate electrode 126 is formed that completely surrounds all surfaces of the suspended nanowire 108 so as to fabricate a nanowire FET device 100 having a gate-all-around configuration as further illustrated in FIG. 10. Although not illustrated, electrically conductive vias (not shown) may be formed through the flowable insulator material 120 to contact the raised source/drain contacts 118. Electrically conductive source/drain electrodes (not shown) are then formed against the vias to establish an electrical connection with the merged source/drain portions of the nanowires 111 as understood by one of ordinary skill in the art.

As described in detail above, various embodiments provide a nanowire FET device including an etch barrier layer configured to prevent lateral etching beneath source/drain portions of the nanowire, beneath the spacers, and/or beneath the raised source/drain contacts when undercutting semiconductor fins to form suspended nanowires in the gate region. In this manner, device shorting between the gate electrode and the raised source/drain contacts can be prevented.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A semiconductor device, comprising:
   a semiconductor-on-insulator wafer including a buried insulator layer, the buried insulator layer including therein first and second opposing etch barrier regions and a gate region between the etch barrier regions;
   at least one nanowire including a channel portion interposed between opposing first and second source/drain portions, the channel portion suspended in the gate region, the first source/drain portion directly on the first etch barrier region and the second source/drain portion directly on the second etch barrier region; and
   a gate electrode in the gate region, the gate electrode completely surrounding the suspended nanowire; and
   first and second epitaxial raised source/drain regions covering the first and second source/drain portions of the at least one nanowire, respectively,
   wherein the buried insulator layer comprises a first electrical insulating material, and the etch barrier regions comprises a second electrical insulating material different from the first electrical insulating material, and
   wherein the etch barrier regions are between the at least one nanowire and the buried insulator layer, and opposing sidewalls of the gate electrode contact the etch barrier regions,
   wherein a portion of the buried insulator layer beneath the suspended channel portion defines an undercutting region, and the first epitaxial raised source/drain region on the first etch barrier region and the second epitaxial raised source/drain region on the second etch barrier region.

2. The semiconductor device of claim 1, wherein a bottom surface of the channel portion is flush with an upper portion of the etch barrier regions.

3. The semiconductor device of claim 2, wherein the upper portion of the etch barrier regions exclude undercuttings beneath source/drain portions of the at least one nanowire.

4. The semiconductor device of claim 1, further comprising spacers on the sidewalls of the gate electrode, the spacers including a bottom portion atop the etch barrier regions.

5. The semiconductor device of claim 4, wherein undercuttings are excluded from beneath the spacers.

6. The semiconductor device of claim 4, wherein inner sidewalls of the spacers are flush with inner sidewalls of the etch barrier regions.

7. The semiconductor device of claim 1, wherein undercuttings are excluded from beneath the epitaxial raised source/drain regions.

8. The semiconductor device of claim 7, wherein the epitaxial raised source/drain regions comprise silicon (Si) doped with phosphorus (P).

9. The semiconductor device of claim 7, wherein the epitaxial raised source/drain region comprises silicon (Si).

10. The semiconductor device of claim 7, wherein the epitaxial raised source/drain regions comprises silicon germanium (SiGe).

11. The semiconductor device of claim 1, wherein the etch barrier regions are interposed between the first electrical insulating material and the epitaxial raised source/drain regions.

12. The semiconductor device of claim 1, wherein the first electrical insulating material has a first etch rate and the second electrical insulating material has a second etch rate different than the first etch rate.

13. The semiconductor device of claim 12, wherein the first etch rate is less than the second etch rate.

14. The semiconductor device of claim 13, wherein the first electrical insulating material comprises silicon dioxide.

15. The semiconductor device of claim 14, wherein the second electrical insulating material comprises nitrogen-doped oxide.

16. The semiconductor device of claim 14, wherein the second electrical insulating material comprises carbon-doped oxide.

17. The semiconductor device of claim 1, wherein the etch barrier regions have a vertical thickness ranging from 10 nanometers (nm) to 40 nm.

18. The semiconductor device of claim 1, wherein a distance between the undercutting region and a bottom surface of the suspended channel portion ranges from 20 nanometers (nm) to 30 nm.

* * * * *